US012768042B2

(12) United States Patent
Lee et al.

(10) Patent No.: US 12,768,042 B2
(45) Date of Patent: Oct. 20, 2026

(54) ACTIVATOR, METHOD OF FORMING THIN FILM USING ACTIVATOR, SEMICONDUCTOR SUBSTRATE FABRICATED USING METHOD, AND SEMICONDUCTOR DEVICE INCLUDING SEMICONDUCTOR SUBSTRATE

(71) Applicant: SOULBRAIN CO., LTD., Gyeonggi-do (KR)

(72) Inventors: Seung Hyun Lee, Gyeonggi-do (KR); Jae Sun Jung, Gyeonggi-do (KR); Chang Bong Yeon, Gyeonggi-do (KR); Jong Moon Kim, Gyeonggi-do (KR)

(73) Assignee: SOULBRAIN CO., LTD., Gyeonggi-do (KR)

( * ) Notice: Subject to any disclaimer, the term of this patent is extended or adjusted under 35 U.S.C. 154(b) by 0 days.

(21) Appl. No.: 18/848,577

(22) PCT Filed: Mar. 17, 2023

(86) PCT No.: PCT/KR2023/003576
§ 371 (c)(1),
(2) Date: Sep. 19, 2024

(87) PCT Pub. No.: WO2023/195653
PCT Pub. Date: Oct. 12, 2023

(65) Prior Publication Data

US 2025/0223697 A1 Jul. 10, 2025

(30) Foreign Application Priority Data

Apr. 5, 2022 (KR) ........................ 10-2022-0042353
Oct. 27, 2022 (KR) ........................ 10-2022-0140241

(51) Int. Cl.
*C23C 16/455* (2006.01)

(52) U.S. Cl.
CPC .............................. *C23C 16/45553* (2013.01)

(58) Field of Classification Search
None
See application file for complete search history.

(56) References Cited

U.S. PATENT DOCUMENTS

2010/0308261 A1* 12/2010 Kanbe ...................... C01B 9/06 252/189
2012/0323008 A1* 12/2012 Barry ........................ C07F 7/10 206/524.1
2022/0170155 A1* 6/2022 Blakeney .......... H01L 21/28562

FOREIGN PATENT DOCUMENTS

JP 2000147792 A 5/2000
KR 20030059743 A 7/2003
(Continued)

OTHER PUBLICATIONS

Tan Kok Chew et al., "Utilizing tertiary butyl iodide as an effective film quality enhancing agent for atomic layer deposition of HfO2 dielectric thin films" AIP Advances, vol. 11, No. 7, pp. 1-6 (Jul. 2, 2021).
(Continued)

*Primary Examiner* — Shamim Ahmed
*Assistant Examiner* — Bradford M Gates
(74) *Attorney, Agent, or Firm* — SZDC Law PC

(57) ABSTRACT

The present invention relates to an activator, a method of forming a thin film using the activator, a semiconductor substrate fabricated using the method, and a semiconductor device including the semiconductor substrate. According to the present invention, by providing a compound having a predetermined structure as an activator, the reaction rate may be improved by effectively replacing the ligands of an adsorbed precursor, and the thin film growth rate may be appropriately reduced. Thus, even when forming a thin film on a substrate with a complex structure, step coverage and (Continued)

the thickness uniformity of a thin film may be greatly improved, and impurities may be reduced.

8 Claims, 1 Drawing Sheet

(56) References Cited

FOREIGN PATENT DOCUMENTS

| | | | |
|---|---|---|---|
| KR | 20090119186 | A | 11/2009 |
| KR | 20220009838 | A | 1/2022 |
| KR | 20220009906 | A | 1/2022 |
| KR | 20220009909 | A | 1/2022 |
| TW | 202117468 | A | 5/2021 |

OTHER PUBLICATIONS

Rafaiel A. Ovanesyan et al., "Atomic layer deposition of silicon-based dielectrics for semiconductor manufacturing: Current status and future outlook" J. Vac. Sci. Technol. A 37, 060904 (2019) (Sep. 24, 2019).

* cited by examiner

[FIG. 1]
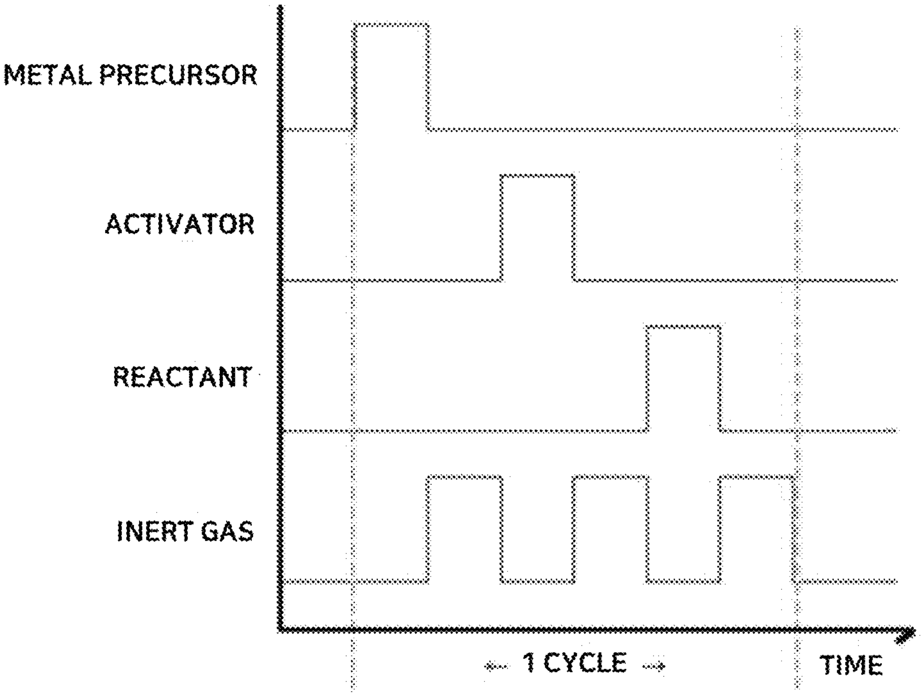
[FIG. 2]
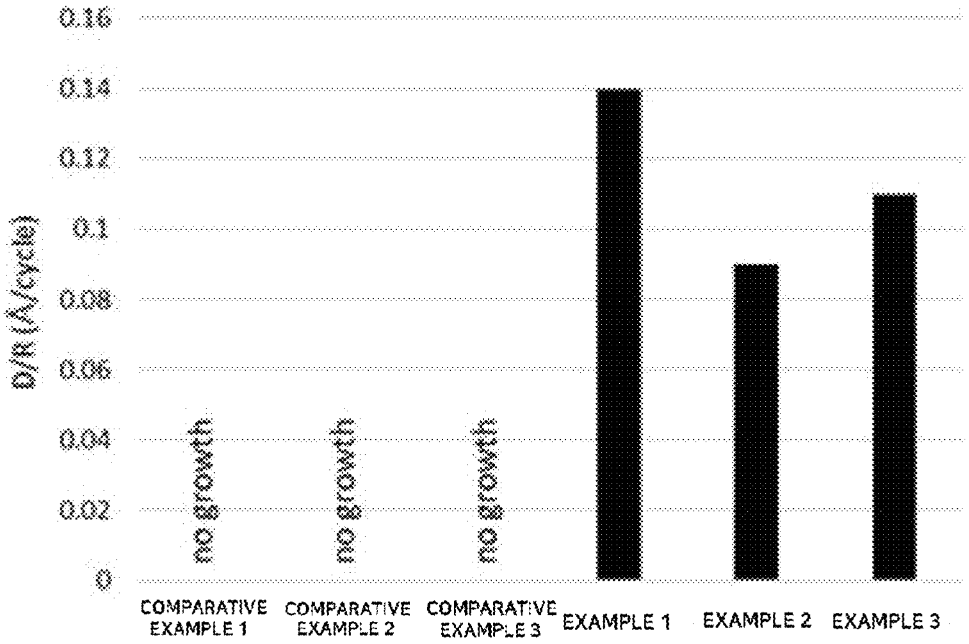

ACTIVATOR, METHOD OF FORMING THIN FILM USING ACTIVATOR, SEMICONDUCTOR SUBSTRATE FABRICATED USING METHOD, AND SEMICONDUCTOR DEVICE INCLUDING SEMICONDUCTOR SUBSTRATE

This application is the National Stage Application of PCT/KR2023/003576, filed on Mar. 17, 2023, which claims priority to Republic of Korea Patent Application Nos. KR 10-2022-0042353, filed on Apr. 5, 2022, and KR 10-2022-0140241, filed on Oct. 27, 2022, all of which are incorporated by reference for all purposes as if fully set forth herein.

TECHNICAL FIELD

The present invention relates to an activator, a method of forming a thin film using the activator, a semiconductor substrate fabricated using the method, and a semiconductor device including the semiconductor substrate. More particularly, according to the present invention, by providing a compound having a predetermined structure as an activator, the reaction rate may be improved by effectively replacing the ligands of a precursor adsorbed on a substrate, and the thin film growth rate may be appropriately reduced. Thus, even when forming a thin film on a substrate with a complex structure, step coverage and the thickness uniformity of a thin film may be greatly improved, and impurities may be greatly reduced.

BACKGROUND ART

In the case of a thin film formed through the conventional atomic layer deposition (ALD) process, the ligands of a precursor compound injected during the deposition process may not be sufficiently removed and may remain in a growing thin film. As a result, contamination occurs due to impurities entering the thin film.

That is, due to the miniaturization of semiconductor devices, when forming a thin film in a horizontal direction, impurities (C, $Cl^-$, $F^-$, etc.) derived from ligands in a thin film may disrupt the crystal arrangement and reduce the density of the formed thin film.

The problem of electrical conductivity degradation due to the low density may occur, and the use of substrates including deep vertical holes (via holes) or trenches is increasing due to the miniaturization and stacking of semiconductor devices.

When filling a cylindrical hole pattern or trench or forming a thin film along the vertical inner wall, it is difficult to uniformly form the thickness of a thin film formed on the top of a pattern and the thickness of the thin film formed on the bottom of a trench, that is, to obtain a step coverage close to 100%.

As a specific example, referring to the previous literature J. Vac. Sci. Technol. A 37, 060904 (2019), since it is impossible to nitride an aminosilane precursor with $NH_3$, a technology for nitriding using $NH_3$ plasma and $N_2$ plasma is disclosed.

However, even when plasma is applied to a narrow and deep hole pattern substrate, the plasma reaches only the upper part of the substrate, forming a nitride film. In addition, since plasma N radicals have a short lifetime, the plasma N radicals cannot reach the inside of the hole and thus cannot form a nitride film.

Therefore, a thin film formation method that enables the formation of a thin film with a complex structure while sufficiently removing the ligands of a precursor compound injected during a deposition process, reduces the residual amount of impurities, and improves step coverage and the thickness uniformity of a thin film; and a semiconductor substrate fabricated by the method are required.

DISCLOSURE

Technical Problem

Therefore, the present invention has been made in view of the above problems, and it is one object of the present invention to provide an activator, a method of forming a thin film using the activator, and a semiconductor substrate fabricated using the method. According to the present invention, by providing a compound having a predetermined structure as an activator, the reaction rate may be improved by effectively replacing the ligands of an adsorbed precursor, and the thin film growth rate may be appropriately reduced. Thus, even when forming a thin film on a substrate with a complex structure, step coverage and the thickness uniformity of a thin film may be greatly improved.

It is another object of the present invention to improve the density, electrical properties, and dielectric properties of a thin film by improving the crystallinity and oxidation fraction of the thin film.

The above and other objects can be accomplished by the present invention described below.

Technical Solution

In accordance with one aspect of the present invention, provided is an activator including a halogenated compound for substituting a ligand included in a precursor compound represented by Chemical Formula 1 below.

[Chemical Formula 1]

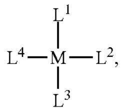

wherein M includes one or more selected from Al, Si, Ti, V, Co, Ni, Cu, Zn, Ga, Ge, Se, Zr, Nb, Mo, Ru, Rh, In, Sn, Sb, Te, Hf, Ta, W, Re, Os, Ir, La, Ce, and Nd; L1, L2, L3, and L4 are —H, —X, —R, —OR, or —NR2 and are the same or different, wherein —X is F, Cl, Br, or I; —R is C1-C10 alkyl, C1-C10 alkene, or C1-C10 alkane and is linear or cyclic; and in L1, L2, L3, and L4, the n number of L ranges from 2 to 6 depending on the oxidation number of a central metal.

For example, when the central metal is divalent, L1 and L2 may be attached to the central metal as ligands. When the central metal is hexavalent, L1, L2, L3, L4, L5, and L6 may be attached to the central metal. The ligands corresponding to L1 to L6 may be the same or different.

In Chemical Formula 1, L1, L2, L3, and L4 may be —H or —R and may be the same or different. Here, —R may be C1-C10 alkyl, C1-C10 alkene, or C1-C10 alkane and may be linear or cyclic.

In Chemical Formula 1, L1, L2, L3, and L4 may be —H, —OR, or —NR2 and may be the same or different. Here, —R may be H, C1-C10 alkyl, C1-C10 alkene, C1-C10 alkane, iPr, or tBu.

In Chemical Formula 1, L1, L2, L3, and L4 may be —H or —X and may be the same or different. Here, —X may be F, Cl, Br, or I.

The halogen compound may include one or more selected from hydrogen iodide, methyl iodide, ethyl iodide, propyl iodide, butyl iodide, isopropyl iodide, and tert-butyl iodide.

The activator may be 3 N to 15 N hydrogen iodide, a gas mixture containing 1 to 99% by weight of 3 N to 15 N hydrogen iodide and an inert gas in an amount that allows a total weight to be 100% by weight, or an aqueous solution mixture containing 0.5 to 70% by weight of 3 N to 15 N hydrogen iodide and water in an amount that allows a total weight to be 100% by weight. Here, the inert gas may be nitrogen, helium, or argon with a purity of 4 N to 9 N.

The activator may have a deposition rate increase rate of 10% or more as calculated by Equation 1 below.

$$\text{Deposition rate increase rate} = [\{(DR_i) - (DR_f)\}/(DR_i)] \times 100 \quad \text{[Equation 1]}$$

In Equation 1, deposition rate (DR, Å/cycle) is the speed at which a thin film is deposited. In the deposition of a thin film formed from a precursor and a reactant, $DR_i$ (initial deposition rate) is the deposition rate of a thin film formed without adding a reaction surface control agent, and $DR_f$ (final deposition rate) is the deposition rate of a thin film formed by adding an activator during the above process. Here, the deposition rate (DR) is measured at room temperature and pressure using an ellipsometer for a thin film with a thickness of 3 to 30 nm, and the unit is Å/cycle.

In Equation 1, the thin film growth rate per cycle, when using and not using the activator, refers to a thin film deposition thickness (Å/cycle) per cycle, i.e., a deposition rate. For example, when measuring the deposition rate, an ellipsometer is used to measure the final thickness of a thin film having a thickness of 3 to 30 nm at room temperature under normal pressure, and then an average deposition rate is calculated by dividing the measured thickness value by the total number of cycles.

The activator may have a refractive index of 1.40 or more, 1.42 to 1.50, 1.43 to 1.48, or 1.44 to 1.48.

The activator may provide a substitution region for an oxide film, a nitride film, a metal film, or a selective thin film thereof.

The substitution region may be formed on an entire substrate or a portion of the substrate on which the oxide film, nitride film, metal film, or selective thin film thereof is formed.

When a total area of a substrate is 100%, the ligand-adsorbed region may occupy 10 to 95% of a total area of the entire substrate or a portion of the substrate, and a ligand non-adsorbed region may occupy the remaining area.

When a total area of a substrate is 100%, a first ligand-adsorbed region may occupy 10 to 95% of a total area of the entire substrate or a portion of the substrate, a second ligand-adsorbed region may occupy 10 to 95% of the remaining area, and the ligand non-adsorbed region may occupy the remaining area.

The thin film may activate a laminated film of one or more selected from the group consisting of Al, Si, Ti, V, Co, Ni, Cu, Zn, Ga, Ge, Se, Zr, Nb, Mo, Ru, Rh, In, Sn, Sb, Te, Hf, Ta, W, Re, Os, Ir, La, Ce, and Nd.

The thin film may be applied to formation of a thin film for use as a diffusion barrier film, an etching stop film, an electrode film, a dielectric film, a gate insulating film, a block oxide film, or a charge trap.

In accordance with another aspect of the present invention, provided is a method of forming a thin film, the method including injecting the activator into a chamber to substitute a ligand of a precursor compound adsorbed on a surface of a loaded substrate.

In accordance with still another aspect of the present invention, provided is a method of forming a thin film, the method including:

1-i) vaporizing the above-described activator to substitute a ligand of a precursor compound adsorbed on a surface of a substrate loaded into a chamber;

1-ii) performing 1st purging inside the chamber with a purge gas;

1-iii) vaporizing the precursor compound and adsorbing the vaporized precursor compound onto a region outside the substitution region;

1-iv) performing 2nd purging inside the chamber with a purge gas;

1-v) supplying a reaction gas inside the chamber; and 1-vi) performing 3rd purging inside the chamber with a purge gas.

In accordance with still another aspect of the present invention, provided is a method of forming a thin film, the method including:

2-i) vaporizing a precursor compound and adsorbing the vaporized precursor compound onto a surface of a substrate loaded into a chamber;

2-ii) performing 1st purging inside the chamber with a purge gas;

2-iii) vaporizing the activator to substitute a ligand of the precursor compound adsorbed on the surface of the substrate loaded in the chamber;

2-iv) performing 2nd purging inside the chamber with a purge gas;

2-v) supplying a reaction gas inside the chamber; and 2-vi) performing 3rd purging inside the chamber with a purge gas.

The precursor compound may be a molecule composed of one or more selected from the group consisting of Al, Si, Ti, V, Co, Ni, Cu, Zn, Ga, Ge, Se, Zr, Nb, Mo, Ru, Rh, In, Sn, Sb, Te, Hf, Ta, W, Re, Os, Ir, La, Ce, and Nd, and may be a precursor having a vapor pressure of greater than 0.01 mTorr and 100 Torr or less at 25° C.

The chamber may be an ALD chamber, a CVD chamber, a PEALD chamber, or a PECVD chamber.

The activator or precursor compound may be vaporized, injected, and then subjected to plasma post-treatment.

In steps 1-ii) and 1-iv) and steps 2-ii) and 2-iv), an amount of the purge gas injected into the chamber may be 10 to 100,000 times a volume of the injected activator.

The reaction gas may be an oxidizing agent, a nitrifying agent, or a reducing agent, and the reaction gas, the activator, and the precursor compound may be transferred into the chamber by a VFC method, a DLI method, or an LDS method.

The thin film may be a molybdenum film, a tungsten film, a silicon nitride film, a silicon oxide film, a titanium nitride film, a titanium oxide film, a tungsten nitride film, a molybdenum nitride film, a hafnium oxide film, a zirconium oxide film, a tungsten oxide film, or an aluminum oxide film.

The substrate loaded into the chamber may be heated to 100 to 800° C., and the ratio of amount (mg/cycle) of the activator and precursor compound fed into the chamber may be 1:1 to 1:20.

In accordance with still another aspect of the present invention, provided is a semiconductor substrate fabricated using the method of forming a thin film described above.

The thin film may have a multilayer structure of two or three layers.

In accordance with yet another aspect of the present invention, provided is a semiconductor device including the above-described semiconductor substrate.

The semiconductor substrate may be low resistive metal gate interconnects, a high aspect ratio 3D metal-insulator-metal capacitor, a DRAM trench capacitor, 3D Gate-All-Around (GAA), or a 3D NAND flash memory.

Advantageous Effects

According to the present invention, the present invention has an effect of providing an activator capable of improving the reaction rate by effectively replacing the ligands of a precursor adsorbed on a substrate and improving the thin film productivity by appropriately increasing the thin film growth rate.

In addition, according to the present invention, by effectively reducing by-products during thin film formation, corrosion or deterioration can be prevented, the crystallinity of a thin film can be improved, and thus the roughness, dielectric constant, and electrical properties of the thin film can be improved.

In addition, the present invention can improve the step coverage and density of a thin film. In addition, the present invention has an effect of providing a method of forming a thin film using the activator and a semiconductor substrate fabricated using the method.

DESCRIPTION OF DRAWINGS

FIG. 1 is a schematic diagram showing a deposition process sequence according to the present invention, focusing on one cycle.

FIG. 2 is a drawing comparing the deposition rate increase rates between Examples 1 to 3 using an activator according to the present invention and Comparative Examples 1 to 3 of the prior art without using an activator.

BEST MODE

Hereinafter, an activator of the present invention, a method of forming a thin film using the activator, and a semiconductor substrate fabricated using the method will be described in detail.

The present inventors confirmed that, by providing a compound capable of replacing the ligands of an adsorbed precursor compound for forming a thin film on the surface of a substrate loaded into a chamber as an activator, the reaction rate was improved by the mechanism of reducing the activation energy of the activator. In addition, even when applied to a substrate having a complex structure, the uniformity of the thin film was secured, and the step coverage was greatly improved. In particular, thin-thickness deposition was possible, and the remaining O, Si, metal, and metal oxides as process by-products and carbon residues, which were difficult to reduce in the past, were reduced. Based on these results, the present inventors conducted further studies on an activator to complete the present invention.

For example, the thin film may be provided with one or more precursors selected from the group consisting of Al, Si, Ti, V, Co, Ni, Cu, Zn, Ga, Ge, Se, Zr, Nb, Mo, Ru, Rh, In, Sn, Sb, Te, Hf, Ta, W, Re, Os, Ir, La, Ce, and Nd, and may provide an oxide film, a nitride film, or a metal film. In this case, the effects desired in the present invention may be sufficiently achieved.

As a specific example, the thin film may have a film composition of a molybdenum film, a tungsten film, a silicon nitride film, a silicon oxide film, a titanium nitride film, a titanium oxide film, a tungsten nitride film, a molybdenum nitride film, a hafnium oxide film, a zirconium oxide film, a tungsten oxide film, or an aluminum oxide film.

The thin film may include the above-described film composition alone or a selective area, and may also include SiH and SiOH, without being limited thereto.

In addition to a commonly used diffusion barrier film, the thin film may be used as an etching stop film, an electrode film, a dielectric film, a gate insulating film, a block oxide film, or a charge trap, and may be applied to a semiconductor device.

When the precursor compound used in the formation of a thin film in the present invention is a precursor molecule having Al, Si, Ti, V, Co, Ni, Cu, Zn, Ga, Ge, Se, Zr, Nb, Mo, Ru, Rh, In, Sn, Sb, Te, Hf, Ta, W, Re, Os, Ir, La, Ce, and Nd as a central metal atom (M) and one or more ligands selected from C, N, O, H, and X (halogen) and having a vapor pressure of 1 mTorr to 100 Torr at 25° C., the effect of substitution by the activator described below may be maximized.

For example, as the precursor compound, a compound represented by Chemical Formula 1 below may be used.

[Chemical Formula 1]

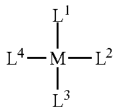

In Chemical Formula 1, M includes one or more selected from Al, Si, Ti, V, Co, Ni, Cu, Zn, Ga, Ge, Se, Zr, Nb, Mo, Ru, Rh, In, Sn, Sb, Te, Hf, Ta, W, Re, Os, Ir, La, Ce, and Nd; L1, L2, L3, and L4 are —H, —X, —R, —OR, or —NR2 and are the same or different. Here, —X is F, Cl, Br, or I; —R is C1-C10 alkyl, C1-C10 alkene, or C1-C10 alkane and is linear or circular; and in L1, L2, L3, and L4, the n number of L ranges from 2 to 6 depending on the oxidation number of the central metal (M).

For example, when the central metal is divalent, L1 and L2 may be attached to the central metal as ligands. When the central metal is hexavalent, L1, L2, L3, L4, L5, and L6 may be attached to the central metal. The ligands corresponding to L1 to L6 may be the same or different.

In Chemical Formula 1, M is hafnium (Hf), silicon (Si) zirconium (Zr), or aluminum (Al), preferably hafnium (Hf) or silicon (Si). In this case, the effect of reducing process by-products and the effect of improving thin film density may be increased, and step coverage and the electrical properties, insulating properties, and dielectric properties of the thin film may be excellent.

L1, L2, L3, and L4 may be —H or —R and may be the same or different. Here, —R may be C1-C10 alkyl, C1-C10 alkene, or C1-C10 alkane and may have a linear or cyclic structure. In this case, an appropriate level of reaction energy may be obtained by substitution by the activator described later.

In addition, L1, L2, L3, and L4 may be —H, —OR, or —NR2 and may be the same or different. Here, —R may be H, C1-C10 alkyl, C1-C10 alkene, C1-C10 alkane, iPr, or tBu. In this case, an appropriate level of reaction energy may be obtained by substitution by the activator described later.

In addition, in Chemical Formula 1, L1, L2, L3, and L4 may be —H, or —X and may be the same or different. Here, —X may be F, Cl, Br, or I. In this case, an appropriate level of reaction energy may be obtained by substitution by the activator described later.

Specifically, examples of the silicon precursor compound may include one or more selected from $SiH_4$, $SiHCl_3$, $SiH_2Cl_2$, $SiCl_4$, $Si_2Cl_6$, $Si_3Cl_8$, $Si_4Cl_{10}$, $SiH_2[NH(C_4H_9)]_2$, $Si_2(NHC_2H_5)_4$, $Si_3NH_4(CH_3)_3$ and $SiH_3[N(CH_3)_2]$, $SiH_2[N(CH_3)_2]_2$, $SiH[N(CH_3)_2]_3$, $Si[N(CH_3)_2]_4$, TEOS (tetraethyl orthosilicate, $Si(OC_2H_5)_4$), DIPAS ([di-isopropylamino silane, $H_3Si[N\{(CH)(CH_3)_2\}]$), BTBAS, $(NH_2)Si(NHMe)_3$, $(NH_2)Si(NHEt)_3$, $(NH_2)Si(NHnPr)_3$, $(NH_2)Si(NHiPr)_3$, $(NH_2)Si(NHnBu)_3$, $(NH_2)Si(NHiBu)_3$, $(NH_2)Si(NHtBu)_3$, $(NMe_2)Si(NHMe)_3$, $(NMe_2)Si(NHEt)_3$, $(NMe_2)Si(NHnPr)_3$, $(NMe_2)Si(NHiPr)_3$, $(NMe_2)Si(NHnBu)_3$, $(NMe_2)Si(NHiBu)_3$, $(NMe_2)Si(NHtBu)_3$, $(NEt_2)Si(NHMe)_3$, $(NEt_2)Si(NHEt)_3$, $(NEt_2)Si(NHnPr)_3$, $(NEt_2)Si(NHiPr)_3$, $(NEt_2)Si(NHnBu)_3$, $(NEt_2)Si(NHiBu)_3$, $(NEt_2)Si(NHtBu)_3$, $(NnPr_2)Si(NHMe)_3$, $(NnPr_2)Si(NHEt)_3$, $(NnPr_2)Si(NHnPr)_3$, $(NnPr_2)Si(NHiPr)_3$, $(NnPr_2)Si(NHnBu)_3$, $(NnPr_2)Si(NHiBu)_3$, $(NnPr_2)Si(NHtBu)_3$, $(NiPr_2)Si(NHMe)_3$, $(NiPr_2)Si(NHEt)_3$, $(NiPr_2)Si(NHnPr)_3$, $(NiPr_2)Si(NHiPr)_3$, $(NiPr_2)Si(NHnBu)_3$, $(NiPr_2)Si(NHiBu)_3$, $(NiPr_2)Si(NHtBu)_3$, $(NnBu_2)Si(NHMe)_3$, $(NnBu_2)Si(NHEt)_3$, $(NnBu_2)Si(NHnPr)_3$, $(NnBu_2)Si(NHiPr)_3$, $(NnBu_2)Si(NHnBu)_3$, $(NnBu_2)Si(NHiBu)_3$, $(NnBu_2)Si(NHtBu)_3$, $(NiBu_2)Si(NHMe)_3$, $(NiBu_2)Si(NHEt)_3$, $(NiBu_2)Si(NHnPr)_3$, $(NiBu_2)Si(NHiPr)_3$, $(NiBu_2)Si(NHnBu)_3$, $(NiBu_2)Si(NHiBu)_3$, $(NiBu_2)Si(NHtBu)_3$, $(NtBu_2)Si(NHMe)_3$, $(NtBu_2)Si(NHEt)_3$, $(NtBu_2)Si(NHnPr)_3$, $(NtBu_2)Si(NHiPr)_3$, $(NtBu_2)Si(NHnBu)_3$, $(NtBu_2)Si(NHiBu)_3$, $(NtBu_2)Si(NHtBu)_3$, $(NH_2)_2Si(NHMe)_2$, $(NH_2)_2Si(NHEt)_2$, $(NH_2)_2Si(NHnPr)_2$, $(NH_2)_2Si(NHiPr)_2$, $(NH_2)_2Si(NHnBu)_2$, $(NH_2)_2Si(NHiBu)_2$, $(NH_2)_2Si(NHtBu)_2$, $(NMe_2)_2Si(NHMe)_2$, $(NMe_2)_2Si(NHEt)_2$, $(NMe_2)_2Si(NHnPr)_2$, $(NMe_2)_2Si(NHiPr)_2$, $(NMe_2)_2Si(NHnBu)_2$, $(NMe_2)_2Si(NHiBu)_2$, $(NMe_2)_2Si(NHtBu)_2$, $(NEt_2)_2Si(NHMe)_2$, $(NEt_2)_2Si(NHEt)_2$, $(NEt_2)_2Si(NHnPr)_2$, $(NEt_2)_2Si(NHiPr)_2$, $(NEt_2)_2Si(NHnBu)_2$, $(NEt_2)_2Si(NHiBu)_2$, $(NEt_2)_2Si(NHtBu)_2$, $(NnPr_2)_2Si(NHMe)_2$, $(NnPr_2)_2Si(NHEt)_2$, $(NnPr_2)_2Si(NHnPr)_2$, $(NnPr_2)_2Si(NHiPr)_2$, $(NnPr_2)_2Si(NHnBu)_2$, $(NnPr_2)_2Si(NHiBu)_2$, $(NnPr_2)_2Si(NHtBu)_2$, $(NiPr_2)_2Si(NHMe)_2$, $(NiPr_2)_2Si(NHEt)_2$, $(NiPr_2)_2Si(NHnPr)_2$, $(NiPr_2)_2Si(NHiPr)_2$, $(NiPr_2)_2Si(NHnBu)_2$, $(NiPr_2)_2Si(NHiBu)_2$, $(NiPr_2)_2Si(NHtBu)_2$, $(NnBu_2)_2Si(NHMe)_2$, $(NnBu_2)_2Si(NHEt)_2$, $(NnBu_2)_2Si(NHnPr)_2$, $(NnBu_2)_2Si(NHiPr)_2$, $(NnBu_2)_2Si(NHnBu)_2$, $(NnBu_2)_2Si(NHiBu)_2$, $(NnBu_2)_2Si(NHtBu)_2$, $(NiBu_2)_2Si(NHMe)_2$, $(NiBu_2)_2Si(NHEt)_2$, $(NiBu_2)_2Si(NHnPr)_2$, $(NiBu_2)_2Si(NHiPr)_2$, $(NiBu_2)_2Si(NHnBu)_2$, $(NiBu_2)_2Si(NHiBu)_2$, $(NiBu_2)_2Si(NHtBu)_2$, $(NtBu_2)_2Si(NHMe)_2$, $(NtBu_2)_2Si(NHEt)_2$, $(NtBu_2)_2Si(NHnPr)_2$, $(NtBu_2)_2Si(NHiPr)_2$, $(NtBu_2)_2Si(NHnBu)_2$, $(NtBu_2)_2Si(NHiBu)_2$, $(NtBu_2)_2Si(NHtBu)_2$, $Si(HNCH_2CH_2NH)_2$, $Si(MeNCH_2CH_2NMe)_2$, $Si(EtNCH_2CH_2NEt)_2$, $Si(nPrNCH_2CH_2NnPr)_2$, $Si(iPrNCH_2CH_2NiPr)_2$, $Si(nBuNCH_2CH_2NnBu)_2$, $Si(iBuNCH_2CH_2NiBu)_2$, $Si(tBuNCH_2CH_2NtBu)_2$, $Si(HNCHCHNH)_2$, $Si(MeNCHCHNMe)_2$, $Si(EtNCHCHNEt)_2$, $Si(nPrNCHCHNnPr)_2$, $Si(iPrNCHCHNiPr)_2$, $Si(nBuNCHCHNnBu)_2$, $Si(iBuNCHCHNiBu)_2$, $Si(tBuNCHCHNtBu)_2$, $(HNCHCHNH)Si(HNCH_2CH_2NH)$, $(MeNCHCHNMe)Si(MeNCH_2CH_2NMe)$, $(EtNCHCHNEt)Si(EtNCH_2CH_2NEt)$, $(nPrNCHCHNnPr)Si(nPrNCH_2CH_2NnPr)$, $(iPrNCHCHNiPr)Si(iPrNCH_2CH_2NiPr)$, $(nBuNCHCHNnBu)Si(nBuNCH_2CH_2NnBu)$, $(iBuNCHCHNiBu)Si(iBuNCH_2CH_2NiBu)$, $(tBuNCHCHNtBu)Si(tBuNCH_2CH_2NtBu)$, $(NHtBu)_2Si(HNCH_2CH_2NH)$, $(NHtBu)_2Si(MeNCH_2CH_2NMe)$, $(NHtBu)_2Si(EtNCH_2CH_2NEt)$, $(NHtBu)_2Si(nPrNCH_2CH_2NnPr)$, $(NHtBu)_2Si(iPrNCH_2CH_2NiPr)$ $(NHtBu)_2Si(nBuNCH_2CH_2NnBu)$, $(NHtBu)_2Si(iBuNCH_2CH_2NiBu)$, $(NHtBu)_2Si(tBuNCH_2CH_2NtBu)$, $(NHtBu)_2Si(HNCHCHNH)$, $(NHtBu)_2Si(MeNCHCHNMe)$, $(NHtBu)_2Si(EtNCHCHNEt)$, $(NHtBu)_2Si(nPrNCHCHNnPr)$, $(NHtBu)_2Si(iPrNCHCHNiPr)$, $(NHtBu)_2Si(nBuNCHCHNnBu)$, $(NHtBu)_2Si(iBuNCHCHNiBu)$, $(NHtBu)_2Si(tBuNCHCHNtBu)$, $(iPrNCH_2CH_2NiPr)Si(NHMe)_2$, $(iPrNCH_2CH_2NiPr)Si(NHEt)_2$, $(iPrNCH_2CH_2NiPr)Si(NHnPr)_2$, $(iPrNCH_2CH_2NiPr)Si(NHiPr)_2$, $(iPrNCH_2CH_2NiPr)Si(NHnBu)_2$, $(iPrNCH_2CH_2NiPr)Si(NHiBu)_2$, $(iPrNCH_2CH_2NiPr)Si(NHtBu)_2$, $(iPrNCHCHNiPr)Si(NHMe)_2$, $(iPrNCHCHNiPr)Si(NHEt)_2$, $(iPrNCHCHNiPr)Si(NHnPr)_2$, $(iPrNCHCHNiPr)Si(NHiPr)_2$, $(iPrNCHCHNiPr)Si(NHnBu)_2$, $(iPrNCHCHNiPr)Si(NHiBu)_2$, and $(iPrNCHCHNiPr)Si(NHtBu)_2$. In this case, an appropriate level of reaction energy may be obtained by substitution by the activator described later.

In addition, examples of the hafnium precursor compound may include tris(dimethylamido)cyclopentadienyl hafnium of $CpHf(NMe_2)_3$ and (methyl-3-cyclopentadienylpropylamino)bis(dimethylamino)hafnium of $Cp(CH_2)_3NM_3Hf(NMe_2)_2$. In this case, an appropriate level of reaction energy may be obtained by substitution by the activator described later.

The activator of the present invention may effectively substitute a ligand in a precursor compound by reducing the activation energy of the precursor compound adsorbed on a substrate. That is, it is desirable to use a compound capable of providing a substitution region for the ligand of a precursor compound adsorbed on a substrate.

For example, the substitution region may be formed on an entire substrate where the thin film is formed or a portion of the substrate.

In addition, when a total area of a substrate is 100%, a substitution region may occupy 10 to 95%, as a specific example, 15 to 90%, preferably 20 to 85%, more preferably 30 to 80%, still more preferably 40 to 75%, still more preferably 40 to 70% of a total area of the entire substrate or a portion of the substrate, and a non-substitution region may occupy the remaining area.

In addition, when a total area of a substrate is 100%, a first substitution region may occupy 10 to 95%, as a specific example, 15 to 90%, preferably 20 to 85%, more preferably 30 to 80%, still more preferably 40 to 75%, still more preferably 40 to 70% of a total area of the entire substrate or a portion of the substrate, a second substitution region may occupy 10 to 95%, as a specific example, 15 to 90%, preferably 20 to 85%, more preferably 30 to 80%, still more preferably 40 to 75%, still more preferably 40 to 70% of the remaining area, and a non-substitution region may occupy the remaining area.

The activator may include one or more selected from hydrogen iodide, methyl iodide, ethyl iodide, propyl iodide, butyl iodide, isopropyl iodide, and tert-butyl iodide. In this case, by forming a ligand substitution region that does not remain in a thin film during thin film formation, a relatively coarse thin film may be formed while suppressing side reactions and controlling the thin film growth rate. Thus, process by-products within a thin film may be reduced, corrosion or deterioration may be prevented, the crystallinity of a thin film may be improved, and a stoichiometric oxidation state may be reached when forming a metal oxide film. Thus, even when a thin film is formed on a substrate having a complex structure, step coverage and the thickness uniformity of a thin film may be greatly improved.

As a specific example, the activator may be 3 N to 15 N hydrogen iodide, a gas mixture containing 1 to 99% by weight of 3 N to 15 N hydrogen iodide and an inert gas in an amount that allows a total weight to be 100% by weight, or an aqueous solution mixture containing 0.5 to 70% by weight of 3 N to 15 N hydrogen iodide and water in an amount that allows a total weight to be 100% by weight. Here, when the inert gas is nitrogen, helium, or argon with a purity of 4 N to 9 N, process by-products may be significantly reduced, step coverage may be excellent, thin film density may be improved, and the electrical properties of a thin film may be excellent.

Preferably, the activator may be 5 N to 6 N hydrogen iodide, a gas mixture containing 1 to 99% by weight of 5 N to 6 N hydrogen iodide and an inert gas in an amount that allows a total weight to be 100% by weight, or an aqueous solution mixture containing 0.5 to 70% by weight of 5 N to 6 N hydrogen iodide and water in an amount that allows a total weight to be 100% by weight. Here, the inert gas may be nitrogen, helium, or argon with a purity of 4 N to 9 N. In this case, by forming a substitution region that does not remain in a thin film during thin film formation, a relatively coarse thin film may be formed while suppressing side reactions and controlling the thin film growth rate. Thus, process by-products in a thin film may be reduced, corrosion or deterioration may be prevented, and the crystallinity of a thin film may be improved. Thus, even when a thin film is formed on a substrate having a complex structure, step coverage and the thickness uniformity of a thin film may be greatly improved.

Preferably, the activator may be 5 N to 6 N hydrogen iodide, a gas mixture containing 1 to 99% by weight of 5 N to 6 N hydrogen iodide and an inert gas in an amount that allows a total weight to be 100% by weight, or an aqueous solution mixture containing 0.5 to 70% by weight of 5 N to 6 N hydrogen iodide and water in an amount that allows a total weight to be 100% by weight. Here, the inert gas may be nitrogen, helium, or argon with a purity of 4 N to 9 N. The activator may have a deposition rate increase rate of 9% or more (deposition rate (D/R) of 0.09 Å/cycle or more), as a specific example, 9 to 25% (D/R: 0.09 to 0.25 Å/cycle), or 9 to 15% (D/R: 0.09 to 0.15 Å/cycle) as calculated by Equation 1 below. In this case, by forming a deposition layer of uniform thickness by the activator having the above-described structure as a substitution region that does not remain in the thin film, a relatively coarse thin film may be formed, and the growth rate of a thin film may be significantly reduced. Thus, even when applied to a substrate having a complex structure, the uniformity of the thin film may be secured, and the step coverage may be greatly improved, deposition in a thin thickness is possible, and the amounts of O, Si, metals, and metal oxides remaining as process by-products may be improved. In addition, even the remaining amount of carbon, which was difficult to reduce in the past, may be improved.

$$\text{Deposition rate increase rate} = [\{(DR_i) - (DR_f)\}/(DR_i)] \times 100 \quad \text{[Equation 1]}$$

In Equation 1, deposition rate (DR, Å/cycle) is the speed at which a thin film is deposited. In the deposition of a thin film formed from a precursor and a reactant, $DR_i$ (initial deposition rate) is the deposition rate of a thin film formed without adding a reaction surface control agent, and $DR_f$ (final deposition rate) is the deposition rate of a thin film formed by adding an activator during the above process. Here, the deposition rate (DR) is measured at room temperature and pressure using an ellipsometer for a thin film with a thickness of 3 to 30 nm, and the unit is Å/cycle.

In Equation 1, the thin film growth rate per cycle, when using and not using the activator, refers to a thin film deposition thickness (Å/cycle) per cycle, i.e., a deposition rate. For example, when measuring the deposition rate, an ellipsometer is used to measure the final thickness of a thin film having a thickness of 3 to 30 nm at room temperature under normal pressure, and then an average deposition rate is calculated by dividing the measured thickness value by the total number of cycles.

In Equation 1, "when the activator is not used" means that a thin film is manufactured by adsorbing only a precursor compound on the substrate in the thin film deposition process. As a specific example, the case refers to a case where a thin film is formed by omitting the step of adsorbing the activator and the step of purging the unadsorbed activator in the method of forming a thin film.

For example, when the activator is a hydrogen iodide compound, the activator may be a compound having a refractive index of 1.4 to 1.42 or 1.43 to 1.5, as a specific example, 1.41 to 1.417 or 1.43 to 1.47, preferably 1.413 to 1.417 or 1.450 to 1.452.

In this case, due to the decrease in activation energy required for the ligand substitution reaction of the activator having the above-described structure on a substrate, the reaction rate may be improved by appropriate substitution of the ligand of the precursor compound adsorbed on the substrate. In addition, even when forming a thin film on a substrate with a complex structure, step coverage and the thickness uniformity of a thin film may be greatly improved. In addition to the thin film precursor, the adsorption of process by-products may be inhibited, so that the surface of the substrate may be effectively protected, and process by-products may be effectively removed.

In particular, a relatively coarse thin film may be formed, and the growth rate of a thin film may be significantly reduced. Thus, even when applied to a substrate having a complex structure, the uniformity of the thin film may be secured, and the step coverage may be greatly improved, deposition in a thin thickness is possible, and the amounts of O, Si, metals, and metal oxides remaining as process by-products may be improved. In addition, even the remaining amount of carbon, which was difficult to reduce in the past, may be improved.

The substitution region for a thin film does not remain on the thin film.

At this time, unless otherwise specified, non-residue refers to a case where the content of C element is less than 0.1 atom %, the content of Si element is less than 0.1 atom %, the content of N element is less than 0.1 atom %, and the content of halogen element is less than 0.1 atom % when analyzed by XPS. More preferably, in the secondary-ion mass spectrometry (SIMS) measurement method or X-ray photoelectron spectroscopy (XPS) measurement method, in which measurements are performed in the depth direction of a substrate, considering the increase/decrease rate of C, N, Si, and halogen impurities before and after using the activator under the same deposition conditions, it is desirable that the increase/decrease rate of the signal sensitivity (intensity) of each element type does not exceed 5%.

For example, the thin film may include a halogen compound in an amount of 100 ppm or less.

The thin film may be used as an etching stop film, an electrode film, a dielectric film, a gate insulating film, a block oxide film, or a charge trap, without being limited thereto.

The activator may be preferably a compound having a purity of 99.9% or more, 99.95% or more, or 99.99% or more. For reference, when a compound having a purity of less than 99% is used, impurities may remain in a thin film or cause side reactions with precursors or reactants. Accordingly, it is desirable to use a material having a purity of 99% or more.

The activator is preferably used in the atomic layer deposition (ALD) process. In this case, the surface of the substrate may be effectively protected without interfering with the adsorption of the precursor compound, and process by-products may be effectively removed.

The activator may preferably have a density of 0.8 to 2.5 $g/cm^3$ or 0.8 to 1.5 $g/cm^3$ and a vapor pressure (20° C.) of 0.1 to 300 mmHg or 1 to 300 mmHg. Within this range, a substitution region may be effectively formed, and step coverage, the thickness uniformity of a thin film, and film quality may be improved.

More preferably, the activator may have a density of 0.75 to 2.0 $g/cm^3$ or 0.8 to 1.3 $g/cm^3$ and a vapor pressure (20° C.) of 1 to 260 mmHg. Within this range, a substitution region may be effectively formed, and step coverage, the thickness uniformity of a thin film, and film quality may be improved.

The method of forming a thin film according to the present invention may include a step of injecting the above-described activator into a chamber to substitute the ligand of a precursor compound adsorbed on the surface of a loaded substrate. In this case, the reaction rate may be improved by effectively substituting the ligand of the precursor adsorbed on the substrate, and the thin film growth rate may be appropriately reduced. Thus, even when forming a thin film on a substrate with a complex structure, step coverage and the thickness uniformity of a thin film may be greatly improved.

In the step of shielding the substrate surface with the activator, the activator may be injected onto the substrate surface at a feeding time (sec) of preferably 0.01 to 5 seconds, more preferably 0.02 to 3 seconds, still more preferably 0.04 to 2 seconds, still more preferably 0.05 to 1 seconds per cycle. Within this range, the thin film growth rate may be reduced, and step coverage and economics may be excellent.

In the present disclosure, the feeding time of the activator is based on a flow rate of 0.1 to 50 mg/cycle at a chamber volume of 15 to 20 L, and more specifically, on a flow rate of 0.8 to 20 mg/cycle at a chamber volume of 18 L.

As a preferred example, the method of forming a thin film may include step 1-i) of vaporizing the activator to substitute a ligand of the precursor compound adsorbed on the surface of the substrate loaded in the chamber; step 1-ii) of performing 1st purging inside the chamber with a purge gas; step 1-iii) of vaporizing a precursor compound and adsorbing the vaporized precursor compound onto the surface of the substrate loaded into the chamber; step 1-iv) of performing 2nd purging inside the chamber with a purge gas; step 1-v) of supplying a reaction gas inside the chamber; and step 1-vi) of performing 3rd purging inside the chamber with a purge gas. At this time, steps 1-i) to 1-vi) may be repeated as a unit cycle until a thin film of the desired thickness is obtained. In this way, in one cycle, when the activator of the present invention is injected before the precursor compound and is absorbed into the substrate, even when deposition is performed at high temperatures, the thin film growth rate may be appropriately reduced, process by-products may be effectively removed, the resistivity of the thin film may be reduced, and the step coverage may be significantly improved.

As another preferred example, the method of forming a thin film may include step 2-i) of vaporizing a precursor compound and adsorbing the vaporized precursor compound onto the surface of a substrate loaded into a chamber; step 2-ii) of performing 1st purging inside the chamber with a purge gas; step 2-iii) of vaporizing the activator to substitute a ligand of the precursor compound adsorbed on the surface of the substrate loaded in the chamber; step 2-iv) of performing 2nd purging inside the chamber with a purge gas; step 2-v) of supplying a reaction gas inside the chamber; and step 2-vi) of performing 3rd purging inside the chamber with a purge gas. At this time, steps 2-i) to 2-vi) may be set as a unit cycle, and the unit cycle may be repeated until a thin film with a desired thickness is obtained. In this way, in one cycle, when the activator of the present invention is introduced after the precursor compound is added and adsorbed onto the substrate, the activator may act as a growth activator for thin film formation. In this case, the thin film growth rate may be increased, the density and crystallinity of a thin film may be increased, and thus the resistivity of the thin film may be reduced. In addition, electrical properties may be greatly improved.

As a preferred example, in the method of forming a thin film according to the present invention, in one cycle, the activator of the present invention may be introduced before the precursor compound and adsorbed onto the substrate. In this case, even when depositing a thin film at high temperatures, process by-products may be significantly reduced and step coverage may be significantly improved by appropriately reducing the thin film growth rate. In addition, the resistivity of a thin film may be reduced by increasing the crystallinity of the thin film. Thus, even when applied to a semiconductor device with a large aspect ratio, the thickness uniformity of a thin film may be greatly improved, thereby ensuring the reliability of the semiconductor device.

For example, in the method of forming a thin film, when the activator is deposited before or after the deposition of the precursor compound, depending on the needs, the unit cycle may be repeated 1 to 99,999 times, preferably 10 to 10,000 times, more preferably 50 to 5,000 times, still more preferably 100 to 2,000 times. Within this range, the desired thickness of the thin film may be obtained, and the effects desired in the present invention may be sufficiently achieved.

For example, in the present invention, the chamber may be an ALD chamber, a CVD chamber, a PEALD chamber, or a PECVD chamber.

In the present invention, the activator or the precursor compound may be vaporized, injected, and then subjected to plasma post-treatment. In this case, the growth rate of a thin film may be improved and process by-products may be reduced.

When the activator is first adsorbed on the substrate, and then the precursor compound is adsorbed, or when the precursor compound is first adsorbed and then the activator is adsorbed, the amount of purge gas injected into the chamber in the step of purging the unadsorbed activator is not particularly limited as long as the amount of purge gas is sufficient to remove the unadsorbed activator. For example, the amount of purge gas may be 10 to 100,000 times, preferably 50 to 50,000 times, more preferably 100 to 10,000 times. Within this range, by effectively removing the unadsorbed activator, a thin film may be formed evenly and deterioration of film quality may be prevented. Here, the input amounts of the purge gas and activator are each based on one cycle, and the volume of the activator refers to the volume of the vaporized activator.

As a specific example, when the activator is injected at a flow rate of 1.66 mL/s for an injection time of 0.5 sec (per cycle), and when the purge gas is injected at a flow rate of 166.6 mL/s for an injection time of 3 sec (per cycle) in the step of purging the unadsorbed activator, the amount of the injected purge gas is 602 times the amount of the injected activator.

In addition, in the step of purging the unadsorbed precursor compound, the amount of purge gas injected into the chamber is not particularly limited as long as the amount is sufficient to remove the unadsorbed precursor compound. For example, the amount may be 10 to 10,000 times, preferably 50 to 50,000 times, more preferably 100 to 10,000 times the volume of the precursor compound injected into the chamber. Within this range, by sufficiently removing the unadsorbed precursor compound, a thin film may be formed evenly and deterioration of film quality may be prevented. Here, the input amounts of the purge gas and precursor compound are each based on one cycle, and the volume of the precursor compound refers to the volume of the vaporized precursor compound.

In addition, in the purging step performed immediately after the reaction gas supply step, the amount of purge gas injected into the chamber may be 10 to 10,000 times, preferably 50 to 50,000 times, more preferably 100 to 10,000 times the volume of reaction gas injected into the chamber. Within this range, the desired effects may be sufficiently achieved. Here, the input amounts of purge gas and reaction gas are based on one cycle.

The activator and precursor compound may be transferred into the chamber preferably by a VFC method, a DLI method, or an LDS method, more preferably by an LDS method.

For example, the substrate loaded into the chamber may be heated to 50 to 400° C. The activator or the precursor compound may be injected onto the substrate in an unheated or heated state, or may be injected unheated and then heated during the deposition process, depending on the deposition efficiency. For example, the activator or the precursor compound may be injected onto the substrate at 50 to 400° C. for 1 to 20 seconds.

The ratio of amount (mg/cycle) of the activator and precursor compound fed into the chamber may be preferably 1:1.5 to 1:20, more preferably 1:2 to 1:15, still more preferably 1:2 to 1:12, still more preferably 1:2.5 to 1:10. Within this range, step coverage may be improved, and process by-products may be significantly reduced.

For example, in the present invention, the precursor compound may be mixed with a non-polar solvent and introduced into the chamber. In this case, the viscosity or vapor pressure of a precursor compound may be easily controlled.

The non-polar solvent may preferably include one or more selected from the group consisting of alkanes and cycloalkanes. In this case, step coverage may be improved even when the deposition temperature is increased during thin film formation, while containing an organic solvent that has low reactivity and solubility and has the advantages of easy moisture management.

As a more preferred example, the non-polar solvent may include C1 to C10 alkanes or C3 to C10 cycloalkanes, preferably C3 to C10 cycloalkanes. In this case, reactivity and solubility may be low, and moisture may be easily managed.

In the present disclosure, C1, C3, etc. indicate the number of carbon atoms.

The cycloalkanes may preferably include C3 to C10 monocycloalkanes. Among the monocycloalkanes, cyclopentane is a liquid at room temperature and has the highest vapor pressure, so cyclopentane may be preferably applied to the vapor deposition process. However, the present invention is not limited thereto.

For example, the non-polar solvent may have a solubility in water (at 25° C.) of 200 mg/L or less, preferably 50 to 400 mg/L, more preferably 135 to 175 mg/L. Within this range, the reactivity toward a precursor compound may be reduced, and moisture may be easily managed.

In the present disclosure, without particular limitation, solubility may be measured according to a measurement method or standard commonly used in the technical field to which the present invention belongs. For example, solubility for a saturated solution may be measured using the HPLC method.

Based on a total weight of the precursor compound and the non-polar solvent, the non-polar solvent may be included in an amount of preferably 5 to 95% by weight, more preferably 10 to 90% by weight, still more preferably 40 to 90% by weight, most preferably 70 to 90% by weight.

When the content of the non-polar solvent exceeds the upper limit, impurities may be generated, which may increase the resistance and the content of impurities in a thin film. When the content of the non-polar solvent is less than the lower limit, the effect of improving step coverage and the effect of reducing impurities such as chloride (Cl) ions due to solvent addition may be reduced.

For example, in the method of forming a thin film, when the activator is used, the deposition rate increase rate expressed as Equation 1 below may be 9% or more (deposition rate (D/R) of 0.09 Å/cycle or more), as a specific example, 9 to 25% (D/R: 0.09 to 0.25 Å/cycle), or 9 to 15% (D/R: 0.09 to 0.15 Å/cycle). In this case, by forming a deposition layer of uniform thickness as a substitution region that does not remain in the thin film due to the difference in the adsorption distribution of the activator having the above-described structure, a relatively coarse thin film may be formed, and the growth rate of a thin film may be significantly reduced. Thus, even when applied to a substrate having a complex structure, the uniformity of the thin film may be secured, and the step coverage may be greatly improved, deposition in a thin thickness is possible, and the amounts of O, Si, metals, and metal oxides remaining as process by-products may be improved. In addition, even the remaining amount of carbon, which was difficult to reduce in the past, may be improved.

$$\text{Deposition rate increase rate} = [\{(DR_i) - (DR_f)\}/(DR_i)] \times 100 \quad \text{[Equation 1]}$$

In Equation 1, deposition rate (DR, Å/cycle) is the speed at which a thin film is deposited. In the deposition of a thin film formed from a precursor and a reactant, $DR_i$ (initial deposition rate) is the deposition rate of a thin film formed without adding a reaction surface control agent, and $DR_f$ (final deposition rate) is the deposition rate of a thin film formed by adding an activator during the above process.

Here, the deposition rate (DR) is measured at room temperature and pressure using an ellipsometer for a thin film with a thickness of 3 to 30 nm, and the unit is Å/cycle.

In the method of forming a thin film, the residual halogen intensity (c/s) in the thin film may be preferably 100,000 or less, more preferably 70,000 or less, still more preferably 50,000 or less, still more preferably 10,000 or less, as a preferred example, 5,000 or less, still more preferably 1,000 to 4,000, still more preferably 1,000 to 3,800 as measured using a thin film having a thickness of 100 Å according to SIMS. Within this range, corrosion and deterioration may be effectively prevented.

In the present disclosure, purging may be performed at preferably 1,000 to 50,000 sccm (standard cubic centimeter per minute), more preferably 2,000 to 30,000 sccm, still more preferably 2,500 to 15,000 sccm. Within this range, the thin film growth rate per cycle may be appropriately controlled. In addition, since deposition is performed as an atomic mono-layer or nearly an atomic mono-layer, the film quality may be improved.

The atomic layer deposition (ALD) process is very advantageous in manufacturing integrated circuits (ICs) that require a high aspect ratio. In particular, the ALD process has advantages such as excellent conformality, uniformity, and precise thickness control due to the self-limiting thin film growth mechanism.

For example, the method of forming a thin film may be performed at a deposition temperature of 50 to 800° C., preferably 100 to 700° C., more preferably 200 to 650° C., still more preferably 220 to 400° C., still more preferably 220 to 300° C. Within this range, a thin film with excellent film quality may be grown while implementing ALD process characteristics.

For example, the method of forming a thin film may be performed at a deposition pressure of 0.01 to 20 Torr, preferably 0.1 to 20 Torr, more preferably 0.1 to 10 Torr, most preferably 0.3 to 7 Torr. Within this range, a thin film having a uniform thickness may be obtained.

In the present disclosure, the deposition temperature and the deposition pressure may be measured as temperature and pressure formed within the deposition chamber, or as temperature and pressure applied to the substrate within the deposition chamber.

The method of forming a thin film may preferably include a step of increasing the temperature inside the chamber to the deposition temperature before introducing the activator into the chamber; and/or a step of purging by injecting inert gas into the chamber before introducing the activator into the chamber.

In addition, as a thin film manufacturing device capable of implementing the thin film manufacturing method, the present invention may include a thin film manufacturing device including an ALD chamber, a first vaporizer for vaporizing a activator, a first transport means for transporting the vaporized activator into the ALD chamber, a second vaporizer for vaporizing a thin film precursor, and a second transport means for transporting the vaporized thin film precursor into the ALD chamber. Here, vaporizers and transport means commonly used in the technical field to which the present invention pertains may be used in the present invention without particular limitation.

As a specific example, according to the method of forming a thin film, first, a substrate on which a thin film is to be formed is placed in a deposition chamber capable of atomic layer deposition.

The substrate may include a semiconductor substrate such as a silicon substrate or a silicon oxide substrate.

The substrate may further have a conductive layer or insulating layer formed thereon.

To deposit a thin film on the substrate positioned in the deposition chamber, the above-described activator and the precursor compound or a mixture of the precursor compound and a non-polar solvent are prepared.

Next, the prepared activator is injected into a vaporizer, changed into a vapor phase, transferred to the deposition chamber to be adsorbed on the substrate, and purging is performed to remove the unadsorbed activator.

Next, the prepared precursor compound or a mixture of the precursor compound and the non-polar solvent (a composition for forming a thin film) is injected into the vaporizer, changed into a vapor phase, transferred to the deposition chamber, and adsorbed onto the substrate. Then, the ligand of the precursor compound is replaced by the pre-injected activator, and the unadsorbed precursor compound is purged.

In the present disclosure, when necessary, the order of the process of removing the unadsorbed activator by purging after adsorbing the activator on the substrate and the process of adsorbing the precursor compound onto the substrate and purging to remove the unadsorbed precursor compound may be changed.

In the present disclosure, for example, the activator and precursor compound (a composition for forming a thin film) may be transferred to the deposition chamber by a vapor flow control (VFC) method of transferring vaporized gas by using a mass flow controller (MFC) method or a liquid delivery system (LDS) method of transferring a liquid by using a liquid mass flow controller (LMFC) method, preferably an LDS method.

At this time, as a carrier gas or dilution gas for moving the activator, the precursor compound, and the like onto the substrate, a mixed gas containing one or more selected from the group consisting of argon (Ar), nitrogen ($N_2$), and helium (He) may be used, without being limited thereto.

In the present disclosure, for example, as the purge gas, an inert gas, preferably the carrier gas or the dilution gas may be used.

Next, a reaction gas is supplied. Any reaction gas commonly used in the technical field to which the present invention belongs may be used in the present invention without particular limitation. The reaction gas may preferably include a nitriding agent. The nitriding agent and the precursor compound adsorbed on the substrate react to form a nitride film.

Preferably, the nitriding agent may be nitrogen gas ($N_2$), hydrazine gas ($N_2H_4$), or a mixture of nitrogen gas and hydrogen gas.

Next, the unreacted residual reaction gas is purged using the inert gas. Accordingly, not only the excess reaction gas but also the generated byproducts may be removed.

As described above, in the method of forming a thin film, for example, a step of supplying an activator onto a substrate, a step of purging the unadsorbed activator, a step of adsorbing a precursor compound/a composition for forming a thin film onto the substrate, a step of purging the unadsorbed precursor compound, a step of supplying a reaction gas, and a step of purging the residual reaction gas may be set as a unit cycle, and the unit cycle may be repeated until a thin film having a desired thickness is formed.

As another example, in the method of forming a thin film, a step of adsorbing a precursor compound/a composition for forming a thin film onto a substrate, a step of purging the unadsorbed precursor compound, a step of supplying an activator onto the substrate, a step of purging the unadsorbed activator, a step of supplying a reaction gas, and a step of purging the residual reaction gas may be set as a unit cycle, and the unit cycle may be repeated until a thin film having a desired thickness is formed.

For example, the unit cycle may be repeated 1 to 99,999 times, preferably 10 to 1,000 times, more preferably 50 to 5,000 times, still more preferably 100 to 2,000 times. Within this range, the desired thin film properties may be effectively expressed.

In addition, the present invention provides a semiconductor substrate, and the semiconductor substrate is fabricated by the thin film formation method. In this case, the step coverage and thickness uniformity of a thin film may be excellent, and the density and electrical properties thereof may be excellent.

The manufactured thin film may preferably have a thickness of 20 nm or less, a reference resistivity value of 50 to 400 μΩ·cm based on a thin film thickness of 10 nm, a halogen content of 10,000 ppm or less, and a step coverage of 90% or more. Within this range, the thin film has excellent performance as a diffusion barrier and may reduce corrosion of metal wiring materials, without being limited thereto.

For example, the thin film may have a thickness of 0.1 to 20 nm, preferably 1 to 20 nm, more preferably 3 to 25 nm, still more preferably 5 to 20 nm. Within this range, thin film properties may be excellent.

For example, the thin film may have a reference resistivity value of 0.1 to 400 μΩ·cm, preferably 15 to 300 μΩ·cm, more preferably 20 to 290 μΩ·cm, still more preferably 25 to 280 pQ cm based on a thin film thickness of 10 nm. Within this range, thin film properties may be excellent.

The thin film may have a halogen content of preferably 10,000 ppm or less or 1 to 9,000 ppm, still more preferably 5 to 8,500 ppm, still more preferably 100 to 1,000 ppm. Within this range, thin film properties may be excellent, and the thin film growth rate may be reduced. Here, for example, halogens remaining in the thin film may be $Cl_2$, Cl, or $Cl^-$. As the amount of halogen residue in the thin film decreases, the film quality improves, so it is desirable to reduce the amount of halogen residue in the thin film.

For example, the thin film may have a step coverage of 90% or more, preferably 92% or more, more preferably 95% or more. Within this range, since even a thin film of complex structure may be easily deposited on a substrate, the thin film may be applied to next-generation semiconductor devices.

The manufactured thin film may have a thickness of preferably 20 nm or less, a carbon, nitrogen, and halogen content of 10,000 ppm or less based on a thin film thickness of 10 nm, and a step coverage of 90% or more. Within this range, the thin film may have excellent performance as a dielectric film or blocking film, without being limited thereto.

For example, when necessary, the thin film may have a multilayer structure of two or three layers. As a specific example, the multilayer film with a two-layer structure may have a lower layer-middle layer structure, and the multilayer film with a three-layer structure may have a lower layer-middle layer-upper layer structure.

For example, the lower layer may be formed of one or more selected from the group consisting of Si, $SiO_2$, MgO, $Al_2O_3$, CaO, $ZrSiO_4$, $ZrO_2$, $HfSiO_4$, $Y_2O_3$, $HfO_2$, $LaLuO_2$, $Si_3N_4$, SrO, $La_2O_3$, $Ta_2O_5$, BaO, and $TiO_2$.

For example, the middle layer may be formed of $Ti_xN_y$, preferably TN.

For example, the upper layer may be formed of one or more selected from the group consisting of W and Mo.

Hereinafter, preferred examples and drawings are presented to help understand the present invention, but the following examples and drawings are only illustrative of the present invention, and it is obvious to those skilled in the art that various changes and modifications are possible within the scope and technical idea of the present invention. Such changes and modifications fall within the scope of the appended patent claims.

EXAMPLES

Examples 1 to 3, Comparative Examples 1 to 3

An ALD deposition process was performed according to FIG. 1 below using the components shown in Table 1 below.

FIG. 1 below is a schematic diagram showing the deposition process sequence according to the present invention, focusing on one cycle.

Specifically, 5 N hydrogen iodide was prepared as an activator.

In addition, as precursors, bis(tertiary-butylamino)silane (BTBAS), di-isopropylamino silane (DIPAS), and bis-diethylamino silane (BDEAS) were prepared.

As shown in FIG. 1 below, the prepared precursor compound was placed in a separate canister and supplied to a separate vaporizer heated to 100° C. at a flow rate of 0.5 g/min using a liquid mass flow controller (LMFC) at room temperature. The precursor vaporized in a vapor phase from the vaporizer was introduced into a deposition chamber for 5 seconds, and then argon gas was supplied at 5000 sccm for 30 seconds to perform argon purging. At this time, the pressure inside the reaction chamber was controlled to 2.5 Torr.

Next, the prepared activator was introduced into the deposition chamber loaded with a substrate using a mass flow controller (MFC) at a flow rate of 500 sccm for 10 seconds at room temperature, and then argon gas was supplied at 5000 sccm for 30 seconds to perform argon purging. At this time, the pressure inside the reaction chamber was controlled to 3 Torr.

Next, 3000 sccm of ammonia as a reaction gas was injected into the reaction chamber for 10 seconds, followed by argon purging for 30 seconds. At this time, the substrate on which a metal thin film was to be formed was heated under the temperature conditions shown in Table 1 below.

This process was repeated 200 to 400 times to form a self-limiting atomic layer thin film with a thickness of 10 nm.

For the thin films obtained in Examples 1 to 3 and Comparative Examples 1 to 3, the deposition rate increase rate (D/R increase rate) and SIMS C impurities were measured in the following manner, and the results are shown in Table 1 and FIG. 2 below.

Deposition rate increase rate (D/R (dep. rate) increase rate): represents the reduction ratio of the deposition rate after the shielding material was introduced compared to the D/R before the activator was introduced, and was calculated as a percentage using each measured A/cycle value.

Specifically, using an ellipsometer which is a device that measures optical properties such as thickness or refractive index of a thin film by using the polarization characteristics of light for a manufactured thin film, the thickness of a thin film was measured, and the measured value was divided by the number of cycles to calculate the thickness of the thin film deposited per cycle.

TABLE 1

| Classification | Film quality classification | Activator | Activator injection amount (sccm) | Precursor type | Reactant type | Deposition temperature (° C.) | D/R (Å/cycle) |
|---|---|---|---|---|---|---|---|
| Comparative Example 1 | $SiO_2$ | — | — | BTBAS | $NH_3$ | 200 | No growth |
| Comparative Example 2 | $SiO_2$ | — | — | BTBAS | $NH_3$ | 300 | No growth |
| Comparative Example 3 | $SiO_2$ | — | — | BTBAS | $NH_3$ | 400 | No growth |
| Example 1 | $SiO_2$ | HI | 500 | BTBAS | $NH_3$ | 200 | 0.14 |
| Example 2 | $SiO_2$ | HI | 500 | BTBAS | $NH_3$ | 300 | 0.09 |
| Example 3 | $SiO_2$ | HI | 500 | BTBAS | $NH_3$ | 400 | 0.11 |

(In Table 1, BTBAS is an abbreviation for bis(tertiary-butylamino)silane.)

As shown in Table 1 and FIG. 2, in the case of Examples 1 to 3 using the activator according to the present invention, compared to Comparative Examples 1 to 3 without using the activator, the deposition rate increase rate was significantly improved, and impurities were greatly reduced.

In particular, in the case of Examples 1 to 3 using the activator according to the present invention, compared to Comparative Examples 1 to 3 without using the activator, the thin film growth rate increase rate per cycle was 9 to 14%, indicating that the thin film growth rate increase rate was excellent.

The above results show that, when the precursor compound is adsorbed to the surface and the bottom of the hole pattern, and then the activator according to the present invention is applied in a gaseous state, the activator with a small molecular size smoothly reaches the substrate surface and the inside of the hole pattern, and replaces the ligand of the precursor compound adsorbed on the reaction surface with an appropriate substituent.

Ammonia, the reaction gas injected thereafter, also has a small molecular size, so ammonia gas can smoothly reach the substrate surface and the inside of the hole pattern, thereby forming a nitride film.

Therefore, it was confirmed that when the activator of the present invention was used in combination with aminosilane as the precursor compound and ammonia as the reaction gas, a nitride film was effectively formed even on a substrate with a complex pattern.

The invention claimed is:

1. A method of forming a thin film on a substrate, comprising injecting an activator into a chamber to substitute a ligand of a precursor compound adsorbed on a surface of a loaded substrate, wherein the substituting a ligand is a self-limiting surface reaction, the precursor comprises an aminosilane compound, and the activator is used in a process in which a thin film is formed by a separate reaction gas after the ligand substitution;

wherein the activator comprises a halogenated compound, and the halogenated compound comprises one or more selected from hydrogen iodide, methyl iodide, ethyl iodide, propyl iodide, butyl iodide, isopropyl iodide, and tert-butyl iodide;

wherein the activator activates a laminated film formed from one or more precursor compounds selected from the group consisting of Al, Si, Ti, V, Co, Ni, Cu, Zn, Ga, Ge, Se, Zr, Nb, Mo, Ru, Rh, In, Sn, Sb, Te, Hf, Ta, W, Re, Os, Ir, La, Ce, and Nd, wherein the thin film is prepared by using the precursor compound represented by Chemical Formula 1 below;

wherein the thin film is applied to formation of the thin film for use as a diffusion barrier film, an etching stop film, an electrode film, a dielectric film, a gate insulating film, a block oxide film, or a charge trap;

wherein the activator is used in a process in which a thin film is formed by a separate reaction gas after the ligand substitution,

[Chemical Formula 1]

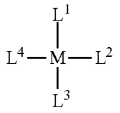

wherein M comprises one or more selected from Al, Si, Ti, V, Co, Ni, Cu, Zn, Ga, Ge, Se, Zr, Nb, Mo, Ru, Rh, In, Sn, Sb, Te, Hf, Ta, W, Re, Os, Ir, La, Ce, and Nd; L1, L2, L3, and L4 are —H, —X, —R, —OR, or —NR2 and are the same or different, wherein —X is F, Cl, Br. or I; and R is C1-C10 alkyl, C1-C10 alkene, or C1-C10 alkane and is linear or circular.

2. The method according to claim 1, wherein, in Chemical Formula 1, L1, L2, L3, and L4 are —H or —R and are the same or different, wherein —R is C1-C10 alkyl, C1-C10 alkene, or C1-C10 alkane and substitutes a ligand having a linear or cyclic structure.

3. The method according to claim 1 wherein, in Chemical Formula 1, L1, L2, L3, and L4 are —H, —OR, or —NR2 and are the same or different, wherein —R substitutes an H, C1-C10 alkyl, C1-C10 alkene, C1-C10 alkane, iPr, or tBu ligand.

4. The method according to claim 1, wherein, in Chemical Formula 1, L1, L2, L3, and L4 are —H or —X and are the same or different, wherein —X substitutes an F, Cl, Br, or I ligand.

5. The method according to claim 1, wherein the thin film is a molybdenum film, a tungsten film, a silicon nitride film, a silicon oxide film, a titanium nitride film, a titanium oxide film, a tungsten nitride film, a molybdenum nitride film, a hafnium oxide film, a zirconium oxide film, a tungsten oxide film, or an aluminum oxide film.

6. A semiconductor substrate fabricated using the method according to claim 1.

7. The semiconductor substrate according to claim 6, wherein the thin film has a multilayer structure of two or three layers.

8. A semiconductor device comprising the semiconductor substrate according to claim 6.

* * * * *